United States Patent
Peng et al.

(10) Patent No.: US 8,955,530 B2
(45) Date of Patent: Feb. 17, 2015

(54) SYSTEM AND METHOD FOR CLEANING A WAFER CHUCK

(75) Inventors: Jui-Chun Peng, Hsin-Chu (TW); Heng-Jen Lee, Baoshan Township (TW)

(73) Assignee: Taiwan Semiconductor Manufaturing Company, Ltd., Hsin-Chu (TW)

( * ) Notice: Subject to any disclaimer, the term of this patent is extended or adjusted under 35 U.S.C. 154(b) by 473 days.

(21) Appl. No.: 13/008,707

(22) Filed: Jan. 18, 2011

(65) Prior Publication Data

US 2012/0180813 A1 Jul. 19, 2012

(51) Int. Cl.
*B08B 7/00* (2006.01)
*H01L 21/67* (2006.01)

(52) U.S. Cl.
CPC ............... *H01L 21/67028* (2013.01)
USPC ............... 134/198; 134/6; 134/33; 134/149; 15/114; 15/210.1

(58) Field of Classification Search
CPC .......... H01L 21/67046; H01L 21/67028; H01L 21/67051; B08B 1/00–1/006; A47L 9/046; G03F 7/70925
USPC ............ 134/6, 33, 149, 198; 115/114, 363, 115/210.1
See application file for complete search history.

(56) References Cited

U.S. PATENT DOCUMENTS 3,584,577 A * 6/1971 Jeschke ............ 101/218
4,986,182 A * 1/1991 Sawaguchi et al. ....... 101/483
5,145,163 A * 9/1992 Cowan et al. ............ 271/161
5,802,976 A * 9/1998 Friedrichs .............. 101/424
2002/0173872 A1 * 11/2002 Malik ................. 700/164
2003/0200996 A1 * 10/2003 Hiatt et al. ............. 134/21
2005/0132515 A1 * 6/2005 Boyd et al. ............. 15/77
2006/0137714 A1 * 6/2006 Hong .................. 134/2
2008/0145972 A1 * 6/2008 Ishikawa et al. .......... 438/120
2008/0244844 A1 * 10/2008 Tung ................. 15/104.001

FOREIGN PATENT DOCUMENTS

JP 05338122 A * 12/1993
JP 09205074 A * 8/1997
(Continued)

OTHER PUBLICATIONS

KR20080048155A—Machine Translation, Jun. 2009.*
(Continued)

*Primary Examiner* — Michael Kornakov
*Assistant Examiner* — Marc Lorenzi
(74) *Attorney, Agent, or Firm* — Slater & Matsil, L.L.P.

(57) ABSTRACT

A wafer chuck is cleaned using a cleaning cap to remove processing residue and particulate matter. The cleaning cap is configured to overlie and align with the wafer chuck and includes a base and a first roller connected to the base and having wound therearound a cleaning cloth. The cleaning cap further includes a second roller connected to the base and having attached thereto a free end of the cleaning cloth. During use, the cleaning cloth winds upon the second roller from the first roller when the second roller rotates about its axis. The cleaning cap can be positioned relative the wafer chuck by way of a manipulator to ensure the cleaning cloth contacts the wafer chuck with sufficient force. The cleaning cloth rubs the wafer chuck with both translational motion and rotational motion.

9 Claims, 4 Drawing Sheets

(56) References Cited

FOREIGN PATENT DOCUMENTS

| KR | 20080049359 | A | * | 6/2008 |
| KR | 20080048155 | A | * | 6/2009 |

OTHER PUBLICATIONS

KR20080049359A—Machine Translation, Jun. 2008.*
JP 09205074—Machine Translation, Aug. 1997.*

* cited by examiner

SYSTEM AND METHOD FOR CLEANING A WAFER CHUCK

BACKGROUND

Various processes in the manufacture of semiconductor devices involve the use of a wafer chuck, i.e., a device that is employed to hold a wafer in place, manipulate the wafer into or out of a processing chamber, rotate the wafer, align and orient the wafer, etc. It is known that a wafer chuck can become dirty during processing steps. Residues and particulate matter can contaminate a chuck and subsequently contaminate other wafers that are placed on the chuck. This contamination can lead to yield and reliability problems. Hence, it is required in the art to frequently remove a wafer chuck (and hence often an entire processing chamber or machine) from service in order to clean the chuck, resulting in the loss of productivity and hence increased costs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
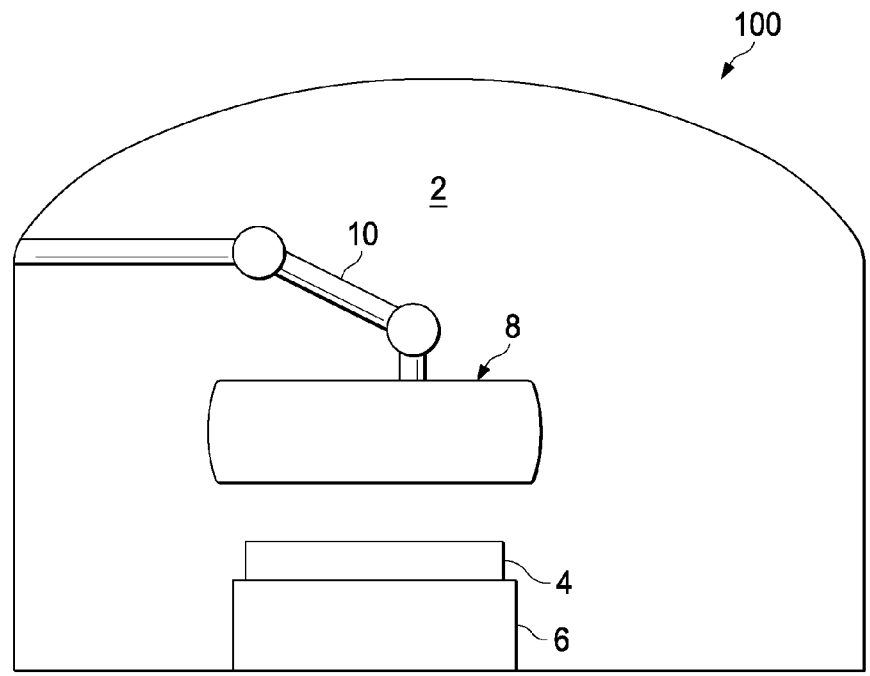
FIGS. 1A and 1B illustrate a processing device employing an embodiment of the invention.

FIG. 1A schematically illustrates a wafer processing device 100. Device 100 includes a chamber 2 in which is located a wafer chuck 4. As is known in the art, wafer chuck 4 is configured to have secured thereto a workpiece, such as a semiconductor wafer to securely hold the wafer thereon.

Wafer chuck 4 is attached to stage 6, which as is known in the art, can position the wafer chuck, and hence a wafer placed upon the wafer chuck, into position, typically providing freedom of movement in three axes as well as providing for rotational movement as well. Wafer chuck 4 typically includes apparatus (not shown) for securing a wafer to the wafer chuck, such as retaining clips or springs, a retaining ring, vacuum orifices, and the like.

Device 100 also includes a cleaning cap 8. FIG. 1A illustrates the processing device 100 wherein cleaning cap 8 is in a first position removed from wafer chuck 4. As illustrated, cleaning cap 8 may be positioned above wafer chuck 4 in the first position. Alternatively, cleaning cap 8 may be positioned outside chamber 2, in a recess of a wall of chamber 2 (not shown), laterally displaced from a top surface of wafer chuck 4, laterally and vertically displaced from the top surface of wafer chuck 4, or any other location that will be apparent to those skilled in the art, informed by the present teaching and through routine experimentation. This first position is the position in which cleaning cap 8 may be stored or located when not in use. Preferably, cleaning cap 8 is stored or located, when not in use, in a position wherein cleaning cap 8 does impede or interfere with the operation of device 100 during its intended use.

Figure 1B:
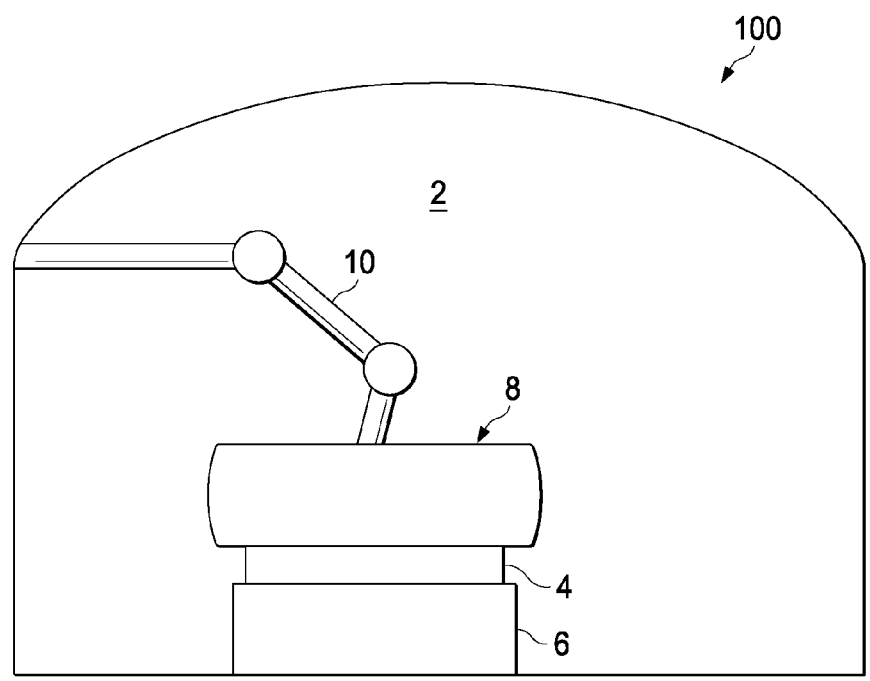

FIG. 1B illustrates cleaning cap 8 in a second position wherein cleaning cap 8 is positioned on or closely adjacent wafer chuck 4. In this second position, portions of cleaning cap 8 may be in contact with wafer chuck 4 as will be described in greater detail below. In some embodiments, cleaning cap 8 is moved between a first position and a second position by way of a manipulator 10, such as a robotic arm, a turn screw mechanism, a spring loaded mechanism, or the like, which manipulator moves cleaning cap 8 between various positions, including the first and second positions described above. In alternative embodiments, cleaning cap 8 and wafer chuck 4 can be moved relative to one other by way of a manipulator attached to wafer chuck 4 (not shown) in lieu of or in addition to a manipulator 10. In still other embodiments, cleaning cap 8 and wafer chuck 4 can be moved relative to one another by way of stage 6 having a degree of freedom in the z direction, in lieu of or in addition to manipulator 10.

Figure 2A:
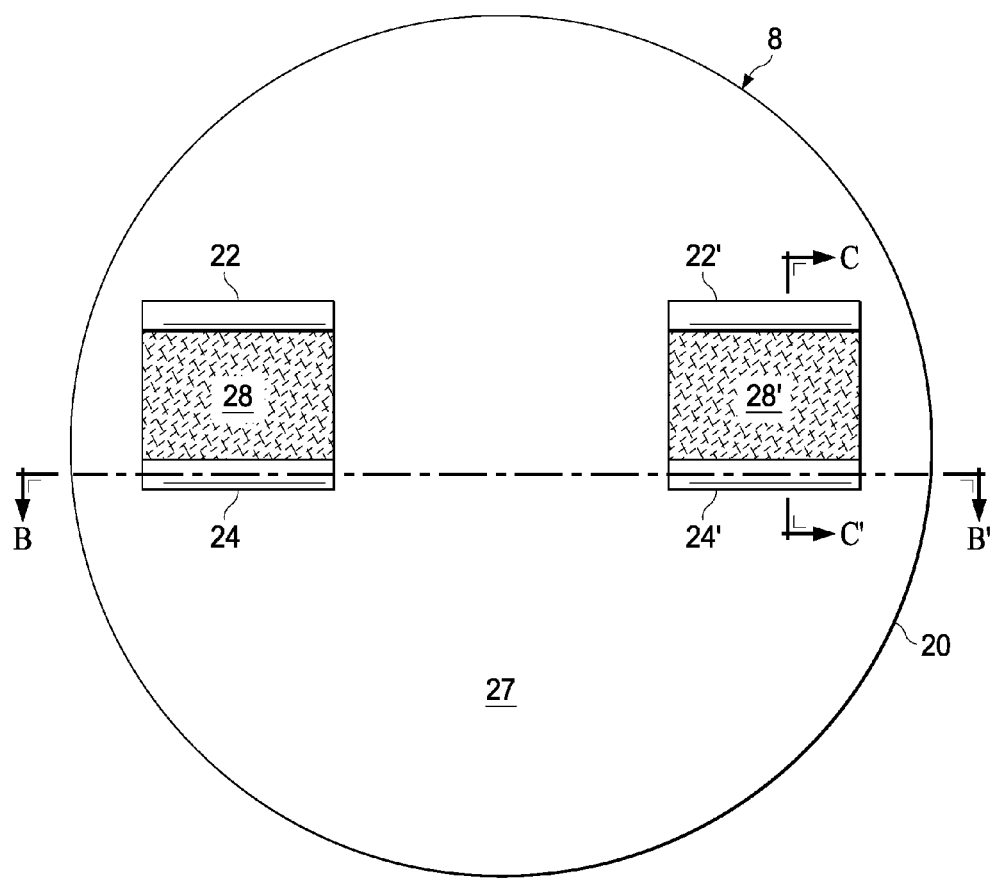
FIGS. 2A and 2B illustrate an embodiment cleaning cap.
Figure 2B:
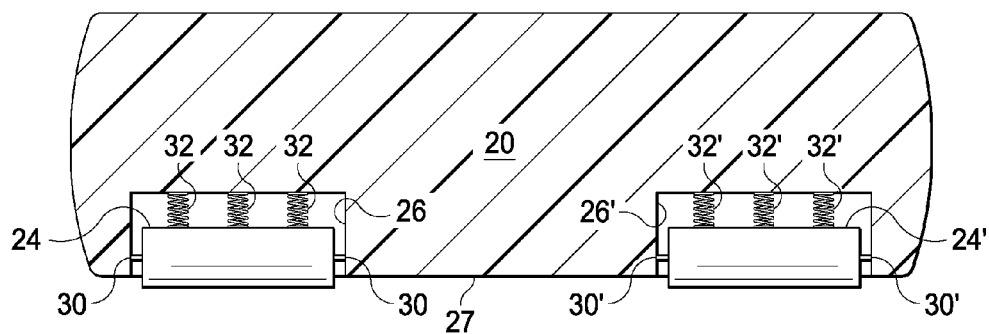

FIG. 2 illustrates cleaning cap 8 in more detail. In some embodiments, cleaning cap 8 includes a base 20 made of plastic, ceramic, nylon, quartz, or other suitable material. In other embodiments, base 20 could be made of metal or a metallic compound. One skilled in the art will recognize, as a matter of routine experimentation, the type of material suited for the particular application. FIG. 2A illustrates in plan view the surface 27 of cleaning cap 8, being the surface that is proximate to or in contact with wafer chuck 4 when cleaning cap 8 is in the above-described described second position. FIG. 2B illustrates cleaning cap 8 in cross-section view along the line B-B' in FIG. 2A.

Cleaning cap 8 includes a first roller 22 and a second roller 24. In the illustrated embodiment, as shown in FIG. 2B, first roller 22 and second roller 24 are located within a recess 26 in bottom surface 27 of base 20. As illustrated in FIG. 2B, by "within" a recess, it meant that the first roller 22 and second roller 24 are substantially within the recess, but that a portion of the roller may extend beyond or below bottom surface 27.

In other embodiments first roller 22 and second roller 24 could be located extending mostly or entirely below bottom surface 27 of base 20, in which case base 20 need not include recess 26. In the illustrated embodiment, cleaning cap 8 further includes a third roller 22' and a fourth roller 24' located within a second recess 26'. This second set of rollers is optional, and one skilled in the art will recognize that any number and combination of rollers could be employed in various embodiments. Typically embodiments will include one, two, or four such rollers but this is provided by way of example and not by limitation. For clarity, only first roller 22, second roller 24 and associated additional elements will be described. Corresponding elements such as third roller 22', fourth roller 24', and their respective associated elements, although illustrated, will not be described—it being understood that the below description applies equally to corresponding ones of these additional optional elements.

Cleaning cloth 28, also shown in FIG. 2A, is typically a thin, dust-free, lint-free, flexible cloth such as polyvinyl alcohol, cotton, a reinforced paper, a synthetic material such as nylon, rayon, polyester, or the like. A first end of cleaning cloth 28 may be attached to first roller 22, such as by an adhesive, a mechanical fastener such as a staple, by forming a pocket in cleaning cloth 28 in which first roller 22 is placed, or by any other means. Cleaning cloth 28 may further be wound around first roller 22, similarly to winding a bolt of cloth around a rod. A second end of cleaning cloth 28 may be attached to second roller 24 using the same attachment scheme as provided for with first roller 22 or a different attachment scheme. In this way, by rotating second roller 24, cleaning cloth 28 is unwound from first roller 22 and pulled toward and wound upon second roller 24. During operation, and as cleaning cloth 28 is unwound from first roller 22 and wound onto second roller 24, cleaning cloth 28 is stretched taut between the two rollers and rubs against a top surface of wafer chuck 4. In this way, wafer chuck 4 is cleaned by operation of cleaning cloth 28 rubbing against it.

As shown in FIG. 2B, second roller 24 is maintained in place within recess 26 by way of axes 30, which allow for rotation of second roller 24. Likewise, although not illustrated, first roller 22 is held in place within recess 26 by axes. Axes 30 associated with second roller 24 and/or the axes associated with first roller 22, and/or both sets of axes are driven by a drive motor (not shown), which drives axes 30 and in turn second roller 24 (and/or first roller 22) to cause the rotational movement whereby cleaning cloth 28 moves from one roller to another. If only one roller, for example second roller 24, is driven by a motor, then cleaning cloth 28 can extend in only one direction (i.e. unwinding from first roller 22 and onto second roller 24). Once cleaning cloth 28 is completely unwound from first roller 22 onto second roller 24, the assembly (e.g., first roller 22, second roller 24, and cleaning cloth 28) will need to be replaced or else cleaning cloth 28 will need to be manually re-wound onto first roller 22 for future operations. In embodiments where both first roller 22 and second roller 24 are driven by a motor, cleaning cloth 28 can be employed numerous times, winding from one roller onto the other and back again, without replacement or manual intervention.

FIG. 2B also illustrates a series of spring mechanisms 32 which operate to maintain second roller 24, and hence cleaning cloth 28, in contact with the surface to be cleaned of cleaning chuck 4. One skilled in the art will recognize that various mechanisms can be employed to ensure that cleaning cloth 28 maintains in close contact with wafer chuck 4 and with sufficient downward pressure to ensure good scrubbing or polishing type action, without such pressure as to damage the surface. In some embodiments, the downward pressure applied is between about 10 and 200 Pa.

Figure 3:
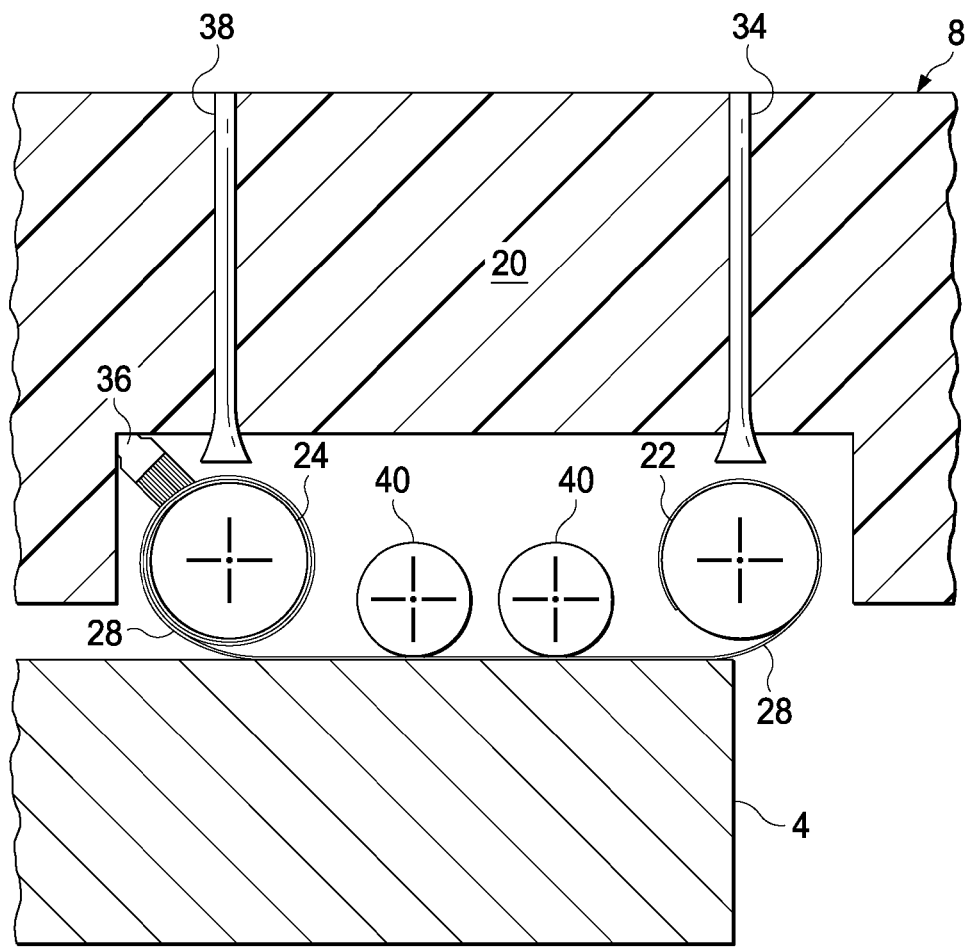
FIG. 3 illustrates an embodiment cleaning cap in greater detail.

FIG. 3 illustrates a portion of cleaning cap 8 in cross-section view along the line C-C' in FIG. 2A. FIG. 3 is shown in larger scale, relative FIG. 2B, to further illustrate illustrative features of some embodiments. Note that in FIG. 3 cleaning cap 8 is shown in the second position wherein cleaning cap 8 is in close proximity to wafer chuck 4. In the illustrated embodiment, rollers 22 and 24 are located within a recess 26 and extend below the bottom surface 27 of base 20 of cleaning cap 8. The amount by which rollers 22 and 24 extend below bottom surface 27 is not critical, but rather the goal is to ensure that cleaning cloth 28 establishes and maintains good contact with wafer chuck 4 in order to clean the surface of same. As discussed above, it may be desirable to have cleaning cloth 28 contact wafer chuck 4 with a downward pressure, which can be accomplished by way of spring mechanisms 32 described above, by way of manipulator 10 applying downward pressure on entire cleaning cap 8, stage 6 applying upward pressure on wafer chuck 4 to engage with cleaning cloth 28, or by other means that will become apparent to one skilled in the art informed by the present teaching and routine experimentation.

Optional, yet advantageous, additional features are illustrated in FIG. 3. One such feature is solvent disperser 34 located adjacent first roller 22. Solvent disperser 34 is located in such a way as to deliver a solvent/cleaning material to cleaning cloth 28. In the illustrated embodiment, solvent disperser 34 is located above first roller 22; in other embodiments, solvent disperser 34 may be located adjacent or below first roller 22. In yet other embodiments, solvent disperser 34 may be located proximate to second roller 24. In yet another embodiment, a first solvent disperser is located proximate first roller 22 and a second solvent disperser (not shown) is located proximate second roller 24. Solvent disperser 34 communicates with a solvent reservoir (not shown) which delivers solvent at an appropriate temperature and pressure to solvent disperser 34 whereby the solvent is sprayed, poured, or otherwise delivered to cleaning cloth 28. In currently anticipated embodiments, solvents such as water, distilled water, acetone, or the like are employed although the scope of the present invention is not limited to the particular solvent and or cleaner employed. In other embodiments, cleaning cloth 28 may be impregnated with a solvent such that a separate solvent disperser is not necessary. In yet other embodiments, solvent disperser 34 may be employed with a solvent-impregnated cleaning cloth 28.

A brush 36 is illustrated adjacent second roller 24. Brush 36 is situated relative second roller 24 so that particulate matter that is removed from wafer chuck 4 and adheres to cleaning cloth 28 can be removed through a brushing motion as cleaning cloth 28 passes under brush 36. Is some embodiments, brush 36 is stationary, whereas in other embodiments, brush 36 is motor driven to provide additional movement relative cleaning cloth 28. Vacuum orifice 38 is also located adjacent second roller 24. In the illustrated embodiment, vacuum orifice 38 applies a vacuum in the immediate vicinity of brush 36 so that particulate matter brushed from cleaning cloth 28 is vacuumed into vacuum orifice 38.

Also illustrated in FIG. 3 are optional rollers 40 located interjacent first roller 22 and second roller 24. Rollers 40 are included to further ensure that cleaning cloth 28 remains taut and tautly pressed against the surface of wafer chuck 4 during the cleaning process. Rollers 40 may be mounted fixed to base 20 or may be mounted using a spring mechanism (not shown) to provide downward pressure on cloth 28. Two rollers 40 are shown in the illustrated embodiment although one, three, four, or more rollers could be employed. In other embodiments, rollers 40 could be replaced by one or more spring mechanisms that extend down and push against cleaning cloth 28 as cleaning cloth 28 slides beneath them.

Note that, as illustrated in FIG. 3, cleaning cap 8 extends beyond an outer edge of wafer chuck 4. Such a configuration, while not mandatory, ensures that the outer edge of wafer chuck 4 will be contacted and hence cleaned by cleaning cloth 28. In some embodiments, wafer chuck 4 is intended to hold a 450 mm diameter wafer and cleaning cap 8 has a diameter ranging from about 450 mm to about 900 mm.

Figure 4A:
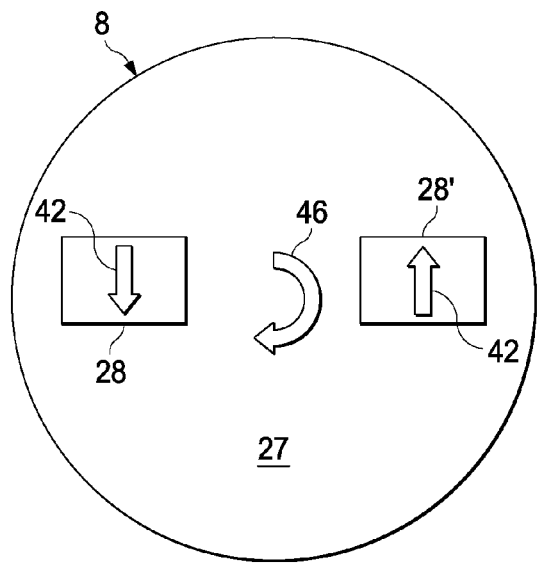
FIGS. 4A through 4C illustrate alternative embodiment cleaning caps.

FIG. 4A illustrates the translational movement of cleaning cloth 28 in a linear direction as it is unwound from first roller 22 and wound onto second roller 24. This is illustrated by arrow 42. At the same time, cleaning cap 8 moves with rotational movement relative wafer chuck 4, as illustrated by arrow 46. By rotational movement relative to the chuck, it is meant that the motion can be the result of rotating cleaning cap 8, rotating wafer chuck 4, or rotating both. Hence, cleaning cloth 28 (and cleaning cloth 28' in the illustrated embodiment) rubs the surface of wafer chuck 4 in a linear fashion 42 (due to the movement from one roller to the next) while at the same time rubbing the surface of wafer chuck 4 in a rotational fashion 46 (due to the rotational movement of cleaning cap 8 relative wafer chuck 4). This provides for a thorough cleaning operation in a relatively short period of time.

Figure 4B:
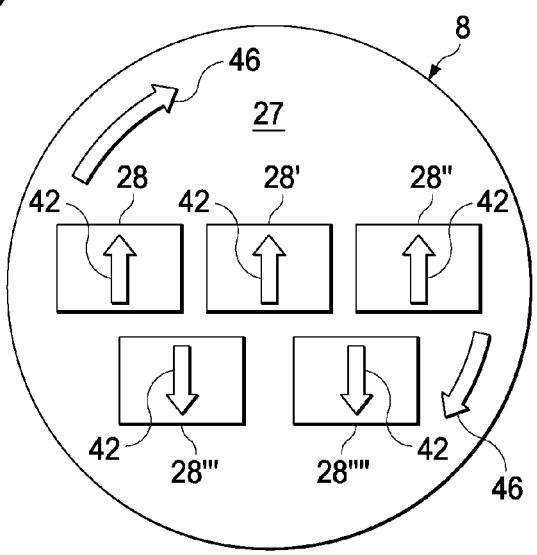

FIG. 4B illustrates another embodiment, in this case having 5 sets of first and second rollers and five cleaning cloths (28 through 28''''). Such an arrangement ensures that the entire wafer chuck surface is cleaned, not just the outer regions. In both FIGS. 4A and 4B, the cleaning cloths 28 are illustrated as moving (linearly) in different directions. In other embodiments, the cleaning cloths 28 could move linearly in the same direction.

Figure 4C:
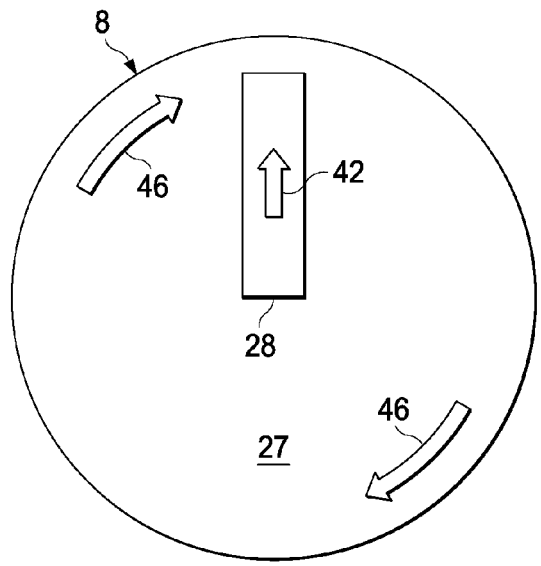

In FIG. 4C a single cleaning cloth is illustrated, extending from the center of cleaning cap 8 towards its outer edge. During use, this cleaning cloth would rub wafer chuck 4 from the center toward the outer edge (the linear motion 42) as it rotated about the wafer chuck (rotational motion 46). Alternatively, cleaning cloth 28 would move from the outer edge toward the middle, and several such cloths could be employed, forming a star pattern.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps

What is claimed is:

1. A device comprising:
   a wafer chuck configured to rotate on a first axis of rotation during a wafer chuck cleaning process;
   a cleaning cap configured to overlie and align with the wafer chuck, the cleaning cap including:
      a base,
      a first roller connected to the base and having wound therearound a cleaning cloth;
      a second roller connected to the base and having attached thereto a free end of the cleaning cloth, such that the cleaning cloth winds upon the second roller from the first roller when the second roller rotates about its axis, wherein the cleaning cloth is configured to rotate on a second axis of rotation during the wafer chuck cleaning process, and wherein the second axis of rotation is orthogonal to the first axis of rotation; and
      a solvent orifice within the cleaning cap and configured to deliver a solvent directly to the cleaning cloth such that the solvent is applied to the wafer chuck by the cleaning cloth;
   a spring mechanism connecting the first and second rollers to the cap, such that the spring mechanism can maintain the first and second rollers pressed against the wafer chuck; and
   a manipulator configured to position the cleaning cap onto the wafer chuck such that the cleaning cloth comes into contact with a surface of the wafer chuck.

2. The device of claim 1 further comprising:
   a third roller connected to the base and having wound therearound a second cleaning cloth; and
   a fourth roller connected to the base and having attached thereto a free end of the second cleaning cloth, such that the second cleaning cloth winds upon the fourth roller from the third roller when the fourth roller rotates about its axis.

3. The device of claim 1 further comprising:
   a brush connected to the base and positioned to sweep particulate matter from the cleaning cloth.

4. The device of claim 3 further comprising a vacuum orifice positioned adjacent the brush, wherein particulate matter swept by the brush is sucked into the vacuum orifice.

5. The device of claim 1 further comprising an actuator configured to move the cleaning cap from a first position above the wafer chuck to a second position on the wafer chuck.

6. The device of claim 5 wherein the actuator is configured to apply a force of between 1 and 20 psi on the wafer chuck when the cleaning cap is in the second position.

7. The device of claim 1 further comprising wherein the spring mechanism is configured to maintain the first and second rollers pressed against the wafer chuck with a force of between 10 and 200 pa.

8. The device of claim 1 wherein the cleaning cloth comprises polyvinyl alcohol (PVA).

9. The device of claim 1 wherein the wafer chuck is configured to receive a 450 mm wafer.

* * * * *